(12) United States Patent
Yedla et al.

(10) Patent No.: US 10,199,204 B2
(45) Date of Patent: Feb. 5, 2019

(54) TARGET RETAINING APPARATUS

(71) Applicant: APPLIED MATERIALS, INC., Santa Clara, CA (US)

(72) Inventors: Srinivasa Yedla, Karnataka (IN); Sundarapandian Reddy, Karnataka (IN); Uday Pai, San Jose, CA (US); Kirankumar Savandaiah, Karnataka (IN); Thanh X. Nguyen, San Jose, CA (US); Muhammad M. Rasheed, San Jose, CA (US); Jallepally Ravi, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 459 days.

(21) Appl. No.: 14/600,915

(22) Filed: Jan. 20, 2015

(65) Prior Publication Data

US 2015/0203960 A1    Jul. 23, 2015

Related U.S. Application Data

(60) Provisional application No. 61/929,006, filed on Jan. 17, 2014.

(51) Int. Cl.
*H01J 37/34* (2006.01)

(52) U.S. Cl.
CPC .................. *H01J 37/3435* (2013.01)

(58) Field of Classification Search
CPC ..................................... H01J 37/3435
See application file for complete search history.

(56) References Cited

U.S. PATENT DOCUMENTS

2008/0202910 A1 * 8/2008 Lutzke ............... H01H 3/3031
200/400

FOREIGN PATENT DOCUMENTS

JP          02285069 A  * 11/1990

* cited by examiner

*Primary Examiner* — John J Brayton
(74) *Attorney, Agent, or Firm* — Moser Taboada; Alan Taboada

(57) ABSTRACT

Embodiments of target retaining apparatus and substrate processing chambers incorporating same are provided herein. In some embodiments, a target retaining apparatus includes a housing including a first slot and a second slot; a cam movably disposed in the housing, wherein movement of the cam is constrained along the first slot; a retaining arm movably coupled to the cam, wherein movement of the retaining arm is constrained along the second slot; a linking member including a first end rotatably coupled to the cam and a second end rotatably coupled to the retaining arm; and a biasing element biasing the cam towards a first position in which the retaining arm extends away from the housing.

20 Claims, 5 Drawing Sheets

TARGET RETAINING APPARATUS

CROSS-REFERENCE TO RELATED APPLICATIONS

This application claims benefit of U.S. provisional patent application Ser. No. 61/929,006, filed Jan. 17, 2014, which is herein incorporated by reference in its entirety.

FIELD

Embodiments of the present disclosure generally relate to substrate processing equipment.

BACKGROUND

Formation of some devices on substrates entails depositing multiple layers of thin films in a deposition chamber, such as a physical vapor deposition (PVD) chamber. The thin films are deposited from a target via a sputtering process. The target is generally disposed opposite the workpiece, or substrate, upon which deposition is performed. The target may be, for example, secured to a lid of the process chamber. However, the inventors have observed that if the target has not been correctly bolted onto the lid of the process chamber, there is a risk that the improperly secured target will drop on the floor, risking injury to personnel and damage to the target or other equipment. In embodiments where the target has a round shape, the target may further roll around on the floor, potentially causing further damage to the target and/or to personnel or surrounding equipment.

Therefore, the inventors have provided an improved target retaining apparatus.

SUMMARY

Embodiments of target retaining apparatus and substrate processing chambers incorporating same are provided herein. In some embodiments, a target retaining apparatus includes a housing including a first slot and a second slot; a cam movably disposed in the housing, wherein movement of the cam is constrained along the first slot; a retaining arm movably coupled to the cam, wherein movement of the retaining arm is constrained along the second slot; a linking member including a first end rotatably coupled to the cam and a second end rotatably coupled to the retaining arm; and a biasing element biasing the cam towards a first position in which the retaining arm extends away from the housing.

In some embodiments, a process chamber includes a chamber body; a lid assembly disposed on an upper surface of the chamber body; a target disposed within the lid assembly; a substrate support disposed within the chamber body; and a target retaining device coupled to the lid assembly. The target retaining device includes a housing including a first slot and a second slot; a cam movably disposed in the housing, wherein movement of the cam is constrained along the first slot; a retaining arm movably coupled to the cam, wherein movement of the retaining arm is constrained along the second slot; a linking member including a first end rotatably coupled to the cam and a second end rotatably coupled to the retaining arm; and a biasing element biasing the cam towards a first position in which the retaining arm extends away from the housing and toward the target.

In some embodiments, a target retaining apparatus includes a housing including a first slot and a second slot perpendicular to the first slot; a cam movably disposed in the housing, wherein the cam includes a first protrusion extending through the first slot to constrain movement of the cam along the first slot; a retaining arm movably coupled to the cam, wherein the retaining arm includes a second protrusion extending through the second slot to constrain movement of the retaining arm along the second slot; a linking member including a first end rotatably coupled to the cam and a second end rotatably coupled to the retaining arm; and a compression spring biasing the cam towards a first position in which the retaining arm extends away from the housing.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the present disclosure depicted in the appended drawings. However, the appended drawings illustrate only typical embodiments of the present disclosure and are therefore not to be considered limiting of scope, for the present disclosure may admit to other equally effective embodiments.

Figure 1:
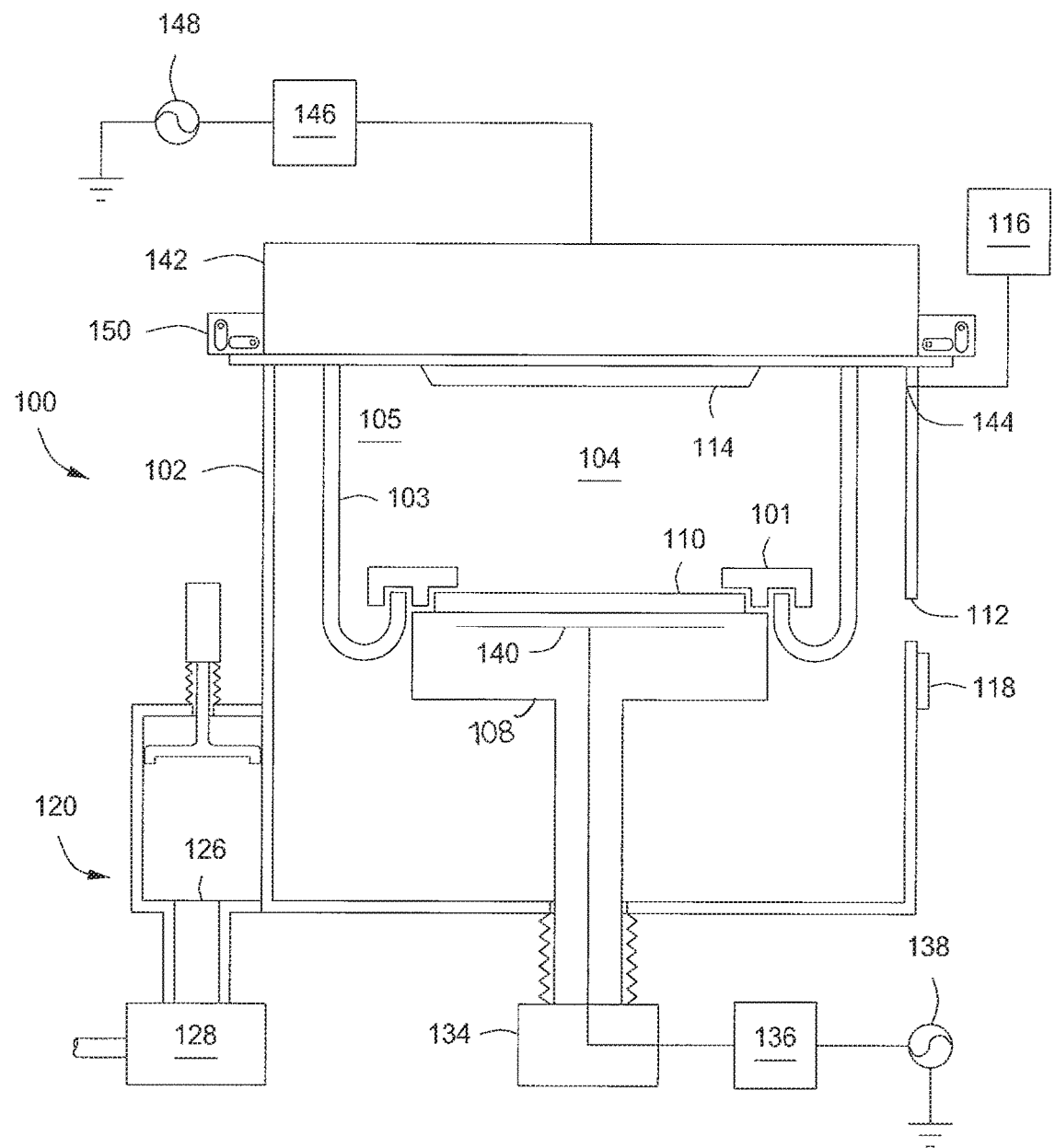
FIG. 1 depicts a process chamber suitable for use with the inventive target retaining apparatus in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a target retaining apparatus and process chambers incorporating same are provided herein. Embodiments of the inventive target retaining apparatus may advantageously prevent an improperly bolted target from falling off a lid of the process chamber. Embodiments of the inventive target retaining apparatuses may advantageously be easily retrofitted to existing process chambers, thus avoiding unnecessary modification of the existing process chambers.

FIG. 1 depicts an illustrative substrate processing chamber suitable for use with the inventive target retaining apparatus in accordance with some embodiments of the present disclosure. The process chamber 100 may comprise a chamber body 102, a lid assembly 142 including a target 114 secured to the lid assembly 142, and a substrate support 108 for retaining a substrate 110 in a position opposite the target 114. The process chamber 100 may be any type of process chamber suitable to process substrates, for example, such as a physical vapor deposition (PVD) chamber. Exemplary process chambers may include process chambers available from Applied Materials, Inc. of Santa Clara, Calif.

The process chamber 100 has an inner volume 105 that may include a processing volume 104. The processing volume 104 may be defined, for example, between the substrate support 108 and the target 114. The process chamber 100 may also include a deposition shield 103 that surrounds the processing volume 104 and prevents deposition of sputtered material onto the walls of the process chamber 100. In some embodiments, the substrate support 108 may include a mechanism that retains the substrate 110 on the substrate support 108, such as, for example, an electrostatic chuck, a vacuum chuck, or the like. Suitable substrates 110 include round substrates, such as 200 mm, 300 mm, 450 mm, or other diameter semiconductor wafers, or rectangular substrates, such as glass panels or the like.

The target 114 is typically bolted onto the lid assembly 142, while the lid assembly is in an open position, to secure the target 114 in place. After securing the target 114, the lid assembly 142 is moved to a closed position atop the chamber body 102 to seal the process chamber 100. A target retaining apparatus 150 is coupled to the lid to retain the target 114 in place during the closing of the lid assembly 142. The target retaining apparatus 150 advantageously retains the target 114 when not bolted or improperly bolted onto the lid assembly 142, thus preventing the target 114 from falling off of the lid assembly 142 and potentially injuring personnel, damaging the target, and/or damaging surrounding equipment.

If the target 114 is properly bolted to the lid assembly 142, then the target retaining apparatus 150 serves as an added precaution. However, if the target 114 is not properly bolted to the lid assembly 142, then the target retaining apparatus 150 holds the improperly secured target 114 in place during the closing of the lid assembly 142, allowing for the lid assembly 142 to be re-opened and the target 114 properly secured without the target 114 falling from the lid assembly 142.

Figure 2A:
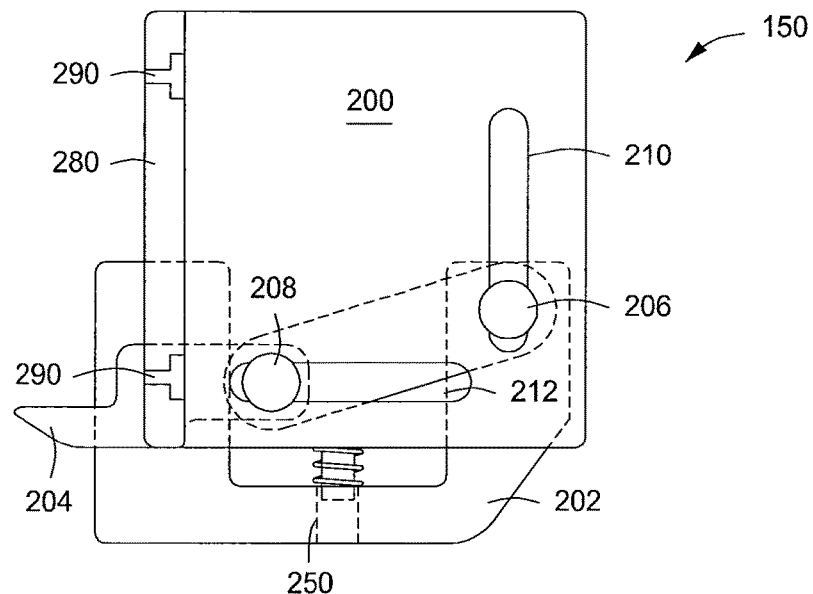
FIGS. 2A-2B depict a side view and a cross sectional side view of a target retaining apparatus in accordance with some embodiments of the present disclosure.
Figure 2B:
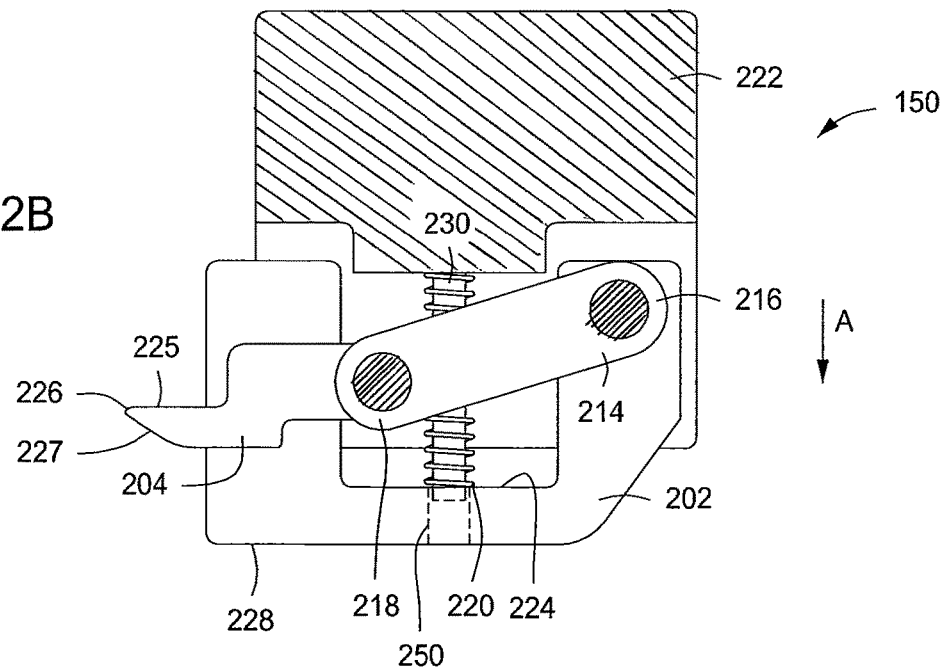

FIG. 2A shows a side view and FIG. 2B shows a cross-sectional side view of the target retaining apparatus 150 in accordance with some embodiments of the present disclosure. The target retaining apparatus 150 may be coupled to the lid assembly 142 (shown in FIG. 1) in any suitable manner (e.g., adhesives, bolts, clamps, or the like). The target retaining apparatus 150 includes a housing 200, a movable cam (cam 202), and a movable retaining arm (retaining arm 204). The housing 200 may include features to facilitate coupling the housing 200 to the lid assembly 142. For example, in some embodiments, the housing 200 may include a flange 280 having openings 290 sized and shaped to receive a plurality of fasteners, such as bolts or the like, to couple the housing 200 to the lid assembly 142 via a corresponding plurality of threaded holes in the lid assembly 142. Alternatively or in combination, the flange 280 may be coupled to the lid assembly 142 in other ways such as, for example, use of adhesives, welding, clamps, or the like.

The retaining arm 204 is configured to move linearly between a first position (an extended position) that extends further away from the housing 200 (as depicted in FIGS. 2A-B), and a second position (a retracted position) where the retaining arm 204 is closer to the housing 200. In the first position, the retaining arm 204 extends away from the housing 200 toward the lid assembly 142 (when mounted to the lid assembly 142). In the second position, the retaining arm 204 is sufficiently retracted to not interfere with the closing of the lid assembly 142 during use. In some embodiments, the linear motion of the retaining arm 204 is substantially parallel to a plane of the bottom of the lid assembly 142.

In some embodiments, the motion of the retaining arm 204 is controlled by the position of the cam 202. For example, a linking member 214 may be rotatably coupled to the cam 202 and to the retaining arm 204. The cam 202 includes a first protrusion 206 that extends through and is moveable within a first slot 210 formed in the housing 200. The retaining arm 204 includes a second protrusion 208 that extends through and is moveable within a second slot 212 formed in the housing. Thus, the first slot 210 defines a direction of movement of the cam 202 and the second slot 212 defines a direction of movement of the retaining arm 204. The movement of the cam 202 is limited to a plane defined by the first slot 210. Movement of the retaining arm 204 is limited to a plane defined by the second slot 212. In some embodiments, the first slot 210 is perpendicular to the second slot 212.

In some embodiments, the linking member 214 is rotatably coupled to the first protrusion 206 of the cam 202 at a first end 216 and to the second protrusion 208 of the retaining arm 204 at a second end 218. A biasing element 220 is provided to apply a force to bias the cam 202 in a direction away from the housing 200 (indicated by arrow A). The biasing element 220 may be, for example, a compression spring, a leaf spring, a torsional spring, or the like. In some embodiments, for example where a compression spring is used, the biasing element 220 may be coupled to an upper portion 222 of an inside of the housing 200 and an upward facing surface 224 of a lower portion of the cam 202. A guide element 230 may be provided to ensure that the bias force of the biasing element 220 is always oriented in the direction indicated by arrow A. That is, the guide element 230 guides the bias force of the biasing element 220 so that the biasing element 220 is oriented in a direction that is substantially normal to the upward facing surface 224 of the cam 202. For example, if the biasing element 220 is a compression spring, the guide element 230 may be a cylindrical protrusion extending through the inner lumen of the compression spring to ensure that the spring bias force is always in the direction indicated by arrow A. In some embodiments, the retaining arm 204 may include an end 226 having a target facing surface 225 and a sloped surface 227, on a side opposite the target facing surface 225. In some embodiments, the cam 202 includes a through hole 250 through which the guide element moves when the cam 202 is forced against the bias of the biasing element 220.

Figure 4A:
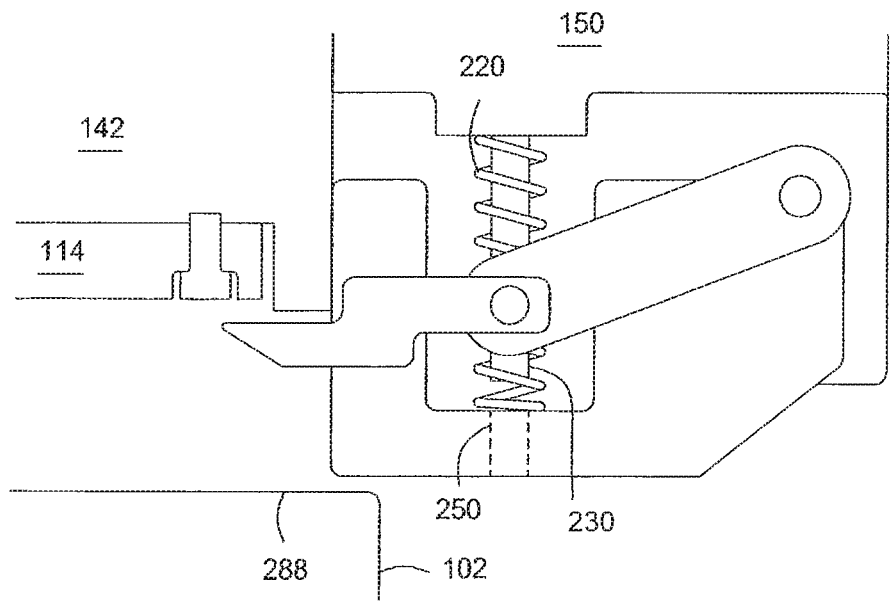
FIGS. 4A-4C depict side views of various positions of a target retaining apparatus in accordance with some embodiments of the present disclosure.
Figure 4B:
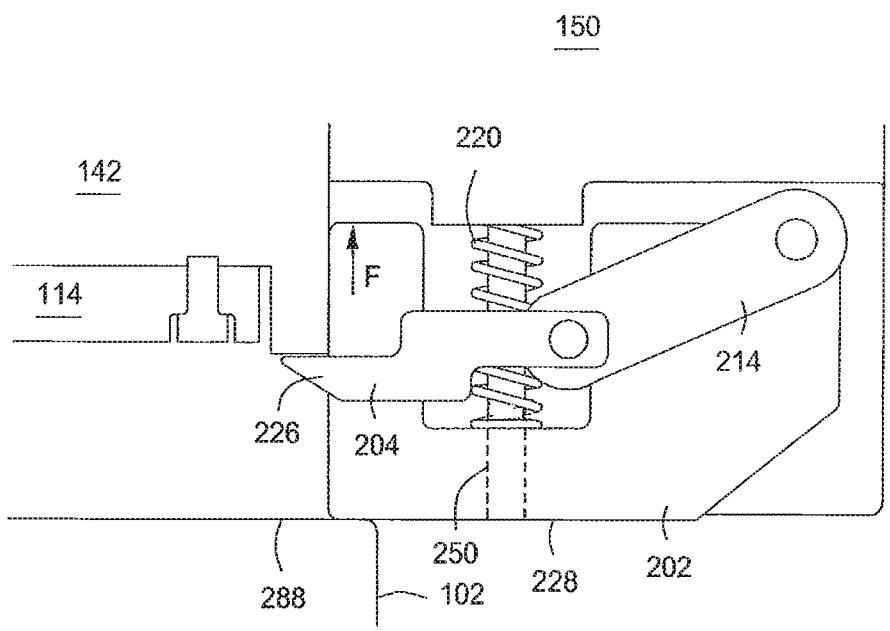
Figure 4C:
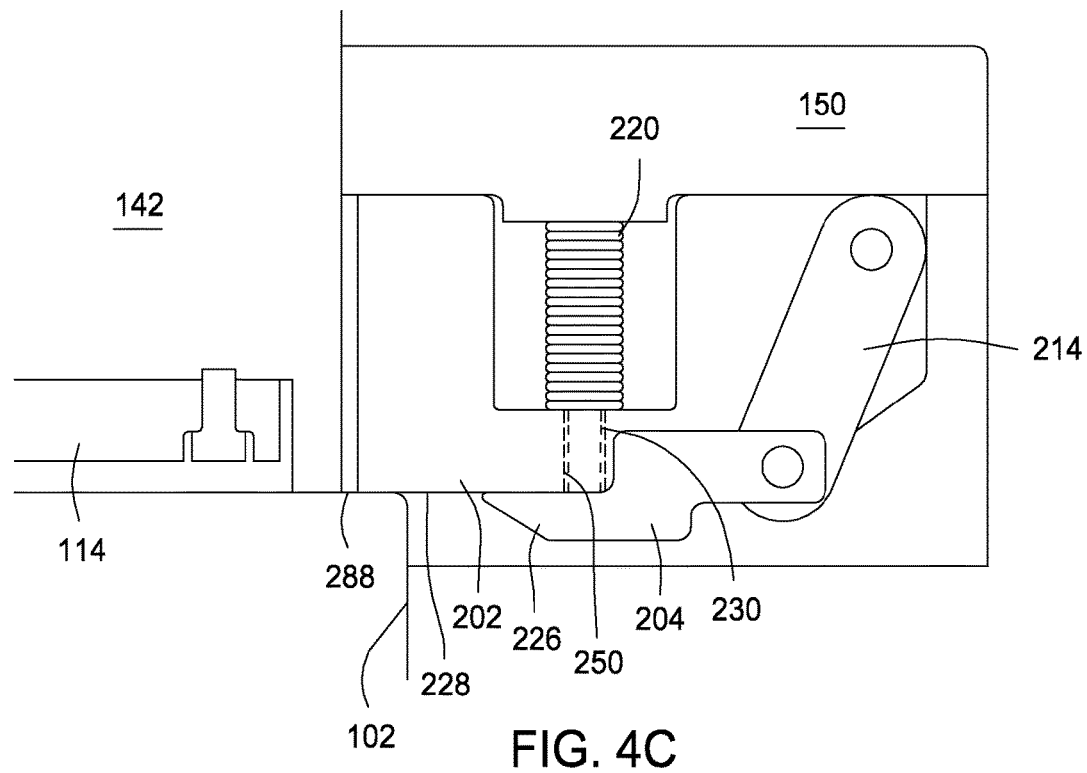

During use, the end 226 of the retaining arm 204 initially extends over the target 114 while the lid assembly 142 is in the open position (FIG. 4A). As a target is placed onto the lid assembly 142, the target 114 first contacts the sloped surfaces 227 of ends 226, causing the ends 226 to move out of the way and allow the target to drop into place on the lid assembly 142, at which point the biasing element causes the retaining arms to extend over the target again. Alternatively, the ends 226 of the retaining arms 204 may be manually moved out of the way. Once in place, the target 114 can be bolted to the lid assembly 142. After the target 114 is placed into the lid assembly 142, the retaining arm 204 is allowed to return to an initial position. As the lid assembly 142 is closed, the retaining arm 204 will prevent the target 114 from falling off of the lid assembly 142 if the target 114 was not properly bolted to the lid assembly 142. Just before a fully closed position of the lid assembly 142 (FIG. 4B), an upper surface 288 of the chamber body 102 contacts a bottom facing surface 228 of the cam 202 and applies a force in a direction indicated by arrow F to the cam 202 that is opposite to the bias force of the biasing element 220 (i.e., opposite of arrow A). When the force becomes greater than the bias force applied by the biasing element 220 (e.g., as the lid continues to be closed), the cam 202 is moved towards an end of the first slot 210 that is furthest away from the second slot 212 (hereinafter "distal end"). The movement of the cam 202 along the first slot 210 is translated to movement of the retaining arm 204 along the second slot 212 via the linking member 214. As the cam 202 and the first end 216 of the linking member 214 move towards the distal end of the first slot 210, the linking member 214 forces the retaining arm 204 to move towards an end of the second slot 212 closer to the first slot 210. As a result, the end 226 of the retaining arm 204 retracts back into the housing 200 and away from the target 114. FIG. 4B illustrates a timeframe in which the end 226 has begun to move to the retracted position, but still extends over a portion of the target 114. As the lid assembly 142 is closed further, the end 226 is retracted further into the housing 200. FIG. 4C illustrates the retaining arm in the fully retracted position, in which the lid assembly 142 is allowed to fully close.

Figure 3:
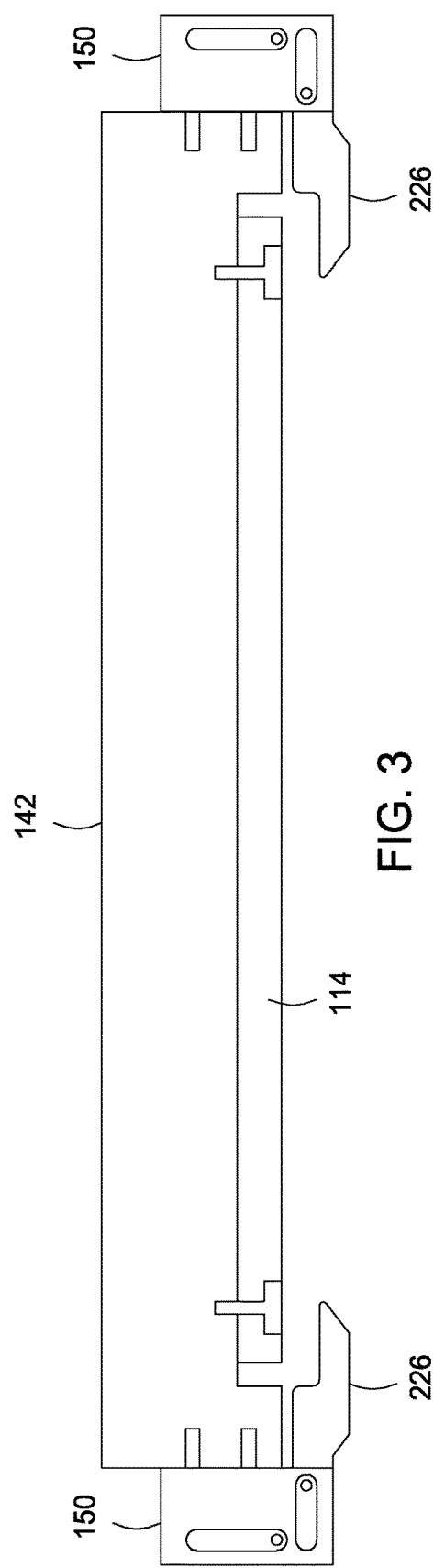
FIG. 3 depicts a target retaining apparatus in accordance with some embodiments of the present disclosure.

FIG. 3 depicts the target retaining apparatus 150 installed at opposite ends of the lid assembly 142. As seen in FIG. 3, the ends 226 are in their initial position extending over the target 114 (e.g., corresponding to an open lid). In some embodiments, a pair of the target retaining apparatus may be disposed at opposing sides of the lid assembly. In some embodiments, greater numbers of the target retaining apparatus may be used, such as three, four, or more. Greater numbers of target retaining apparatus divide the load of a target by a greater number, thus placing lesser load on the target retaining apparatus. In addition, providing three or more target retaining apparatus may advantageously more securely prevent the target from sliding out of place.

Returning to FIG. 1, in some embodiments, the deposition shield 103 extends downwardly past an upper surface of the substrate support and curves back up to terminate near the upper surface (i.e., u-shaped). A deposition ring 101 may be disposed on an end of the deposition shield 103 and may cover a peripheral edge of the substrate 110. During a processing period, the substrate support 108 may be raised into the processing volume 104 by a lift mechanism 134. In the raised position, the deposition ring 101 rests on the peripheral edge of the substrate 110 and prevents the accumulation of materials (e.g., process byproducts, etched substrate materials, or the like) atop an otherwise exposed portion of the substrate support 108. In a lowered position (i.e., when processing is not occurring), the deposition ring 101 may rest on the edge of the deposition shield 103. The deposition ring 101 may be fabricated from any suitable process compatible material, such as a ceramic, for example, aluminum oxide ($Al_2O_3$), silicon nitride (SiN), aluminum nitride (AlN), or the like.

In some embodiments, the substrate support 108 may include an RF bias electrode 140. The RF bias electrode 140 may be coupled to one or more bias power sources (one bias power source 138 shown) through one or more respective matching networks (matching network 136 shown). The bias power source 138 may provide either continuous or pulsed power. In some embodiments, the bias power source may be a DC or pulsed DC source.

The substrate 110 may enter the process chamber 100 via an opening 112 in a wall of the process chamber 100. The opening 112 may be selectively sealed via a slit valve 118, or other mechanism for selectively providing access to the interior of the chamber through the opening 112. The substrate support 108 may be coupled to a lift mechanism 134 that may control the position of the substrate support 108 between a lower position (as shown) suitable for transferring substrates into and out of the chamber via the opening 112 and a selectable upper position suitable for processing. The process position may be selected to maximize process uniformity for a particular process step. When in at least one of the elevated processing positions, the substrate support 108 may be disposed above the opening 112 to provide a symmetrical processing region.

One or more gas inlets 144 may be coupled to a gas supply 116 for providing one or more process gases into the processing volume 104 of the process chamber 100. Although one gas inlet 144, is shown in FIG. 1, additional or alternative gas inlets may be provided, such as nozzles or inlets disposed in other locations of the sidewalls of the process chamber 100 or at other locations suitable for providing gases to the process chamber 100, such as the base of the process chamber, the periphery of the substrate support, or the like.

One or more plasma power sources (one RF power source 148 shown) may be coupled to the process chamber 100, for example via a lid assembly 142, to supply RF power to the target 114, via one or more respective match networks (one match network 146 shown).

An exhaust system 120 is provided and generally includes a vacuum pump 128 coupled to the chamber body 102 via a pumping port 126 for pumping out exhaust gases from the process chamber 100. The vacuum pump 128 may be fluidly coupled to an exhaust outlet for routing the exhaust to appropriate exhaust handling equipment.

While the foregoing is directed to embodiments of the present disclosure, other and further embodiments of the present disclosure may be devised without departing from the basic scope thereof.

The invention claimed is:

1. A target retaining apparatus for retaining a sputtering target in a physical vapor deposition chamber, comprising:
    a housing, configured to be coupled to a lid assembly of a process chamber, including a first slot and a second slot;
    a cam movably disposed in the housing, wherein movement of the cam is constrained along the first slot;
    a retaining arm movably coupled to the cam, wherein movement of the retaining arm is constrained along the second slot;
    a linking member including a first end rotatably coupled to the cam and a second end rotatably coupled to the retaining arm; and
    a biasing element biasing the cam in a direction away from the housing and towards a first position in which the retaining arm extends away from the housing.

2. The target retaining apparatus of claim 1, wherein the first slot is perpendicular to the second slot.

3. The target retaining apparatus of claim 1, wherein when the cam is in the first position, the biasing element causes the cam to extend beyond the housing.

4. The target retaining apparatus of claim 1, further comprising:
    a guide element to orient a bias force of the biasing element in a direction that is normal to an upward facing surface of the cam.

5. The target retaining apparatus of claim 1, wherein the retaining arm is in a retracted position when the cam is in a second position, and wherein, when the cam is in the second position, the cam is retracted into the housing.

6. The target retaining apparatus of claim 5, wherein the cam is in the second position when a force applied to the cam is greater than a bias force of the biasing element.

7. The target retaining apparatus of claim 1, further comprising:

a flange having a plurality of openings to receive a corresponding plurality of fasteners to couple the housing to a lid assembly of a process chamber.

8. The target retaining apparatus of claim 1, wherein the cam includes a first protrusion extending through the first slot to constrain movement of the cam along the first slot, and wherein the retaining arm includes a second protrusion extending through the second slot to constrain movement of the retaining arm along the second slot.

9. A process chamber, comprising:
   a chamber body;
   a lid assembly disposed on an upper surface of the chamber body;
   a target disposed within the lid assembly;
   a substrate support disposed within the chamber body; and
   a target retaining device coupled to the lid assembly, the target retaining device comprising:
      a housing including a first slot and a second slot;
      a cam movably disposed in the housing, wherein movement of the cam is constrained along the first slot;
      a retaining arm movably coupled to the cam, wherein movement of the retaining arm is constrained along the second slot;
      a linking member including a first end rotatably coupled to the cam and a second end rotatably coupled to the retaining arm; and
      a biasing element biasing the cam in a direction away from the housing and towards a first position in which the retaining arm extends away from the housing and toward the target.

10. The process chamber of claim 9, wherein the first slot is perpendicular to the second slot.

11. The process chamber of claim 9, wherein the biasing element is a compression spring.

12. The process chamber of claim 11, wherein the target retaining apparatus further comprises a guide element to orient a bias force of the biasing element in a direction that is normal to an upward facing surface of the cam.

13. The process chamber of claim 9, wherein the retaining arm is in a retracted position when the cam is in a second position.

14. The process chamber of claim 13, wherein the cam is in the second position when a force applied to the cam is greater than a bias force of the biasing element.

15. The process chamber of claim 9, wherein the target retaining apparatus further comprises a flange having a plurality of openings to receive a corresponding plurality of fasteners to couple the housing to the lid assembly via a corresponding plurality of threaded holes in the lid assembly.

16. A target retaining apparatus for retaining a sputtering target in a physical vapor deposition chamber, comprising:
   a housing, configured to be coupled to a lid assembly of a process chamber, including a first slot and a second slot perpendicular to the first slot;
   a cam movably disposed in the housing, wherein the cam includes a first protrusion extending through the first slot to constrain movement of the cam along the first slot;
   a retaining arm movably coupled to the cam, wherein the retaining arm includes a second protrusion extending through the second slot to constrain movement of the retaining arm along the second slot;
   a linking member including a first end rotatably coupled to the cam and a second end rotatably coupled to the retaining arm; and
   a compression spring biasing the cam in a direction away from the housing towards a first position in which the retaining arm extends away from the housing.

17. The target retaining apparatus of claim 16, further comprising:
   a guide element to orient a bias force of the compression spring in a direction that is normal to an upward facing surface of the cam.

18. The target retaining apparatus of claim 16, wherein the retaining arm is in a retracted position when the cam is in a second position.

19. The target retaining apparatus of claim 18, wherein the cam is in the second position when a force applied to the cam is greater than a bias force of the compression spring.

20. The target retaining apparatus of claim 16, further comprising:
   a flange having a plurality of openings to receive a corresponding plurality of fasteners to couple the housing to the lid assembly of the process chamber.

* * * * *